United States Patent [19]

Irmer et al.

[11] Patent Number: 4,910,514

[45] Date of Patent: Mar. 20, 1990

[54] D/A CONVERTER

[75] Inventors: Heimbert Irmer, Haar; Otto Mühlbauer, Munich, both of Fed. Rep. of Germany

[73] Assignee: Siemens Aktiengesellschaft, Berlin and Munich, Fed. Rep. of Germany

[21] Appl. No.: 277,534

[22] Filed: Nov. 28, 1988

Related U.S. Application Data

[63] Continuation of Ser. No. 780,405, Sep. 26, 1985, abandoned.

[30] Foreign Application Priority Data

Sep. 28, 1984 [DE] Fed. Rep. of Germany ....... 3435715

[51] Int. Cl.$^4$ ............................................. H03M 1/74
[52] U.S. Cl. ........................................ 341/64; 341/96; 341/144
[58] Field of Search ................. 341/63, 64, 84, 96, 341/97, 98, 104, 126, 144; 307/362

[56] References Cited

U.S. PATENT DOCUMENTS

| | | | |
|---|---|---|---|
| 3,217,147 | 11/1965 | Chapman, Jr. | 340/347 DA X |
| 3,940,595 | 2/1976 | Turner | 341/899 X |
| 4,276,543 | 6/1981 | Miller et al. | 340/347 AD |
| 4,490,634 | 12/1984 | Hareyama | 307/573 |
| 4,586,025 | 4/1986 | Knierim | 341/64 |
| 4,691,189 | 9/1987 | Dingwall et al. | 341/158 |
| 4,733,220 | 3/1988 | Knierim | 341/64 |
| 4,791,406 | 12/1988 | Mehrgardt et al. | 341/144 |

FOREIGN PATENT DOCUMENTS 0043897 1/1982 European Pat. Off. .

Primary Examiner—William M. Shoop, Jr.
Assistant Examiner—Brian K. Young
Attorney, Agent, or Firm—Herbert L. Lerner; Laurence A. Greenberg

[57] ABSTRACT

A single-step digital-to-analog converter includes a multiplicity of individual interconnected sources disposed in a matrix having matrix rows and matrix columns; a decoder apparatus connected to the matrix for addressing the individual sources, the decoder apparatus including a column decoder for addressing at least the more significant part of an n-bit-wide digital word to be converted and a row decoder in the form of a thermometer decoder.

Logic apparatus is connected between the decoder apparatus and the matrix for determining the matrix column of one of the individual sources being addressed and for suppressing switching over of the individual sources of others of the columns. The logic apparatus includes first and second logic devices, the first logic device being connected between the column decoder and the matrix for deriving further column information ($E_i$) and additional information ($S_i$) from column information ($X_i$) in accordance with the logical equations: $E_i = S_i$ and $S_i = E_i E_{i-1}$. The second logic device being assigned to each of the individual sources ($Q_{ik}$) in accordance with logic equations that determine the connected state of a matrix column.

8 Claims, 6 Drawing Sheets

| $E_i$ | $S_i$ | $Z_K$ | $Q_{ik}$ | |
|---|---|---|---|---|
| 1 | 0 | X | } | $X_i$ |
| 0 | 1 | X | | |
| 1 | 1 | 0 | | |
| 1 | 1 | 1 | | |

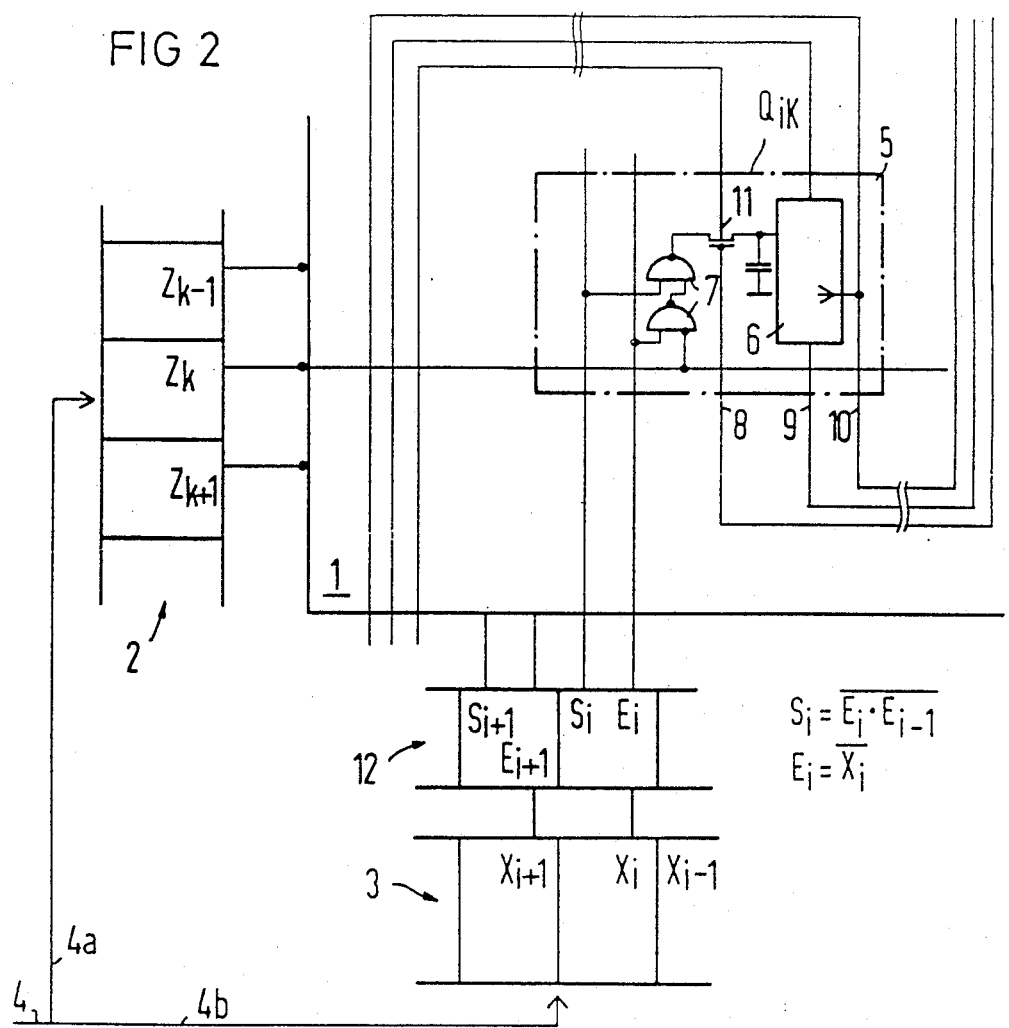

FIG 5
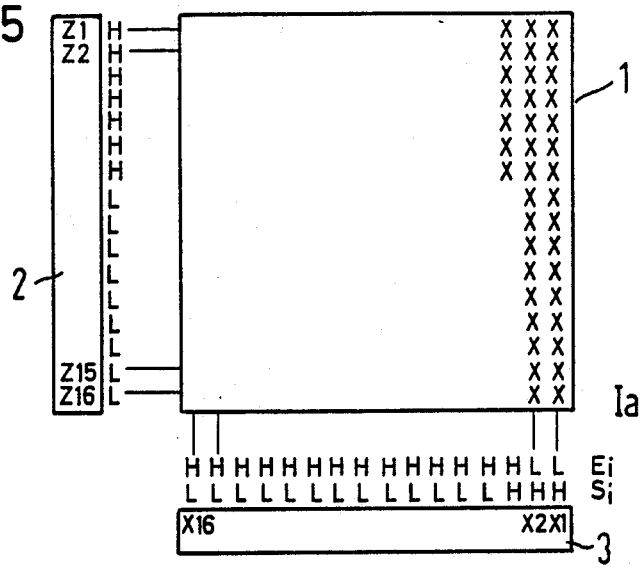
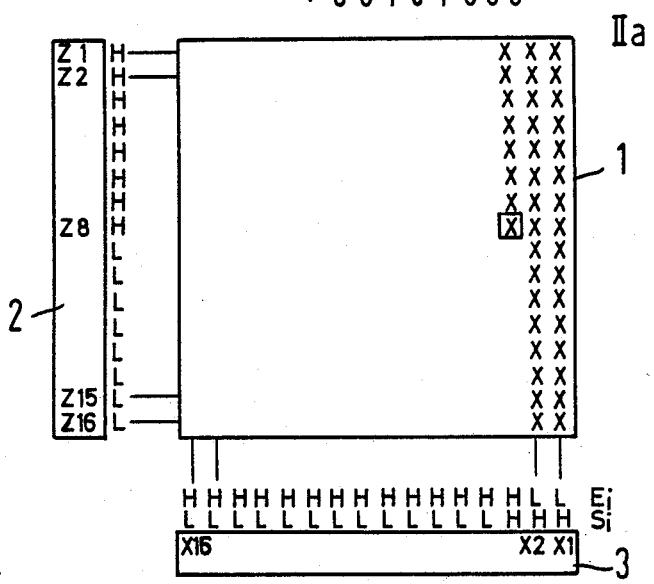

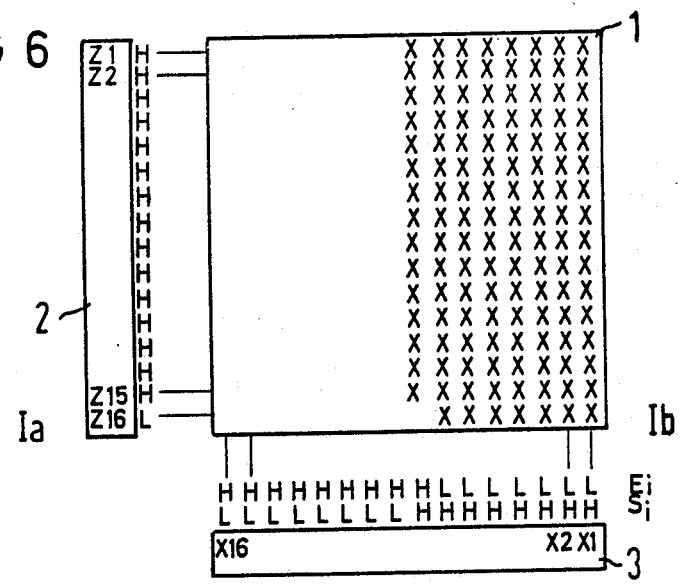
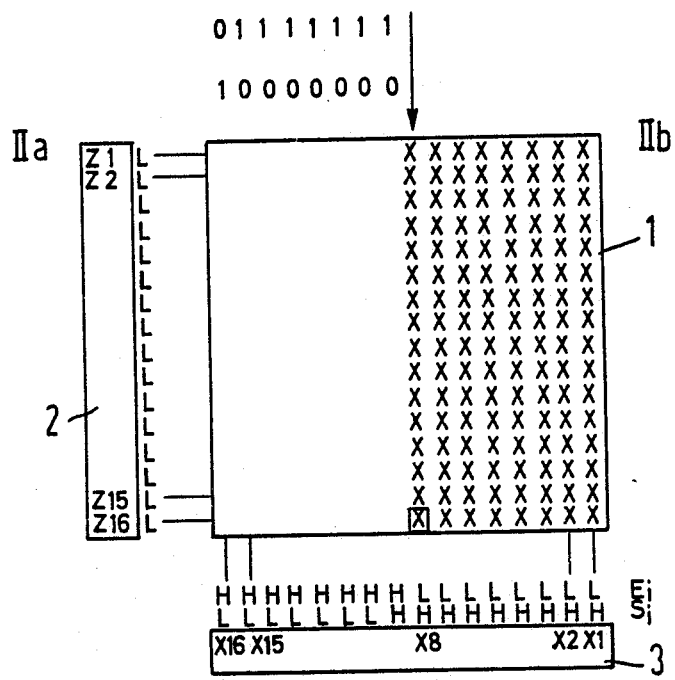
FIG 6

D/A CONVERTER

This application is a continuation of application Ser. No. 780,405, filed Sept. 26, 1985, now abandoned.

SPECIFICATION

The invention relates to a D/A converter, especially a single-step D/A converter with a multiplicity of individual sources which can be connected together and addressed by a decoder apparatus, the individual sources being disposed in matrix-fashion, and wherein at least the more significant part of a digital word which is to be converted and is n-bits wide is addressed by column decoder with the interposition of a logic apparatus in which the matrix column of the actually addressed individual source is determined and a switching-over of the individual sources of the remaining columns is suppressed.

Such a D/A or Digital/Analog converter is known from European Patent Application EP 0043 897, corresponding U.S. Pat. No. 4,490,634.

As is well known, D/A converters work in such a manner that weight sources are addressed by control lines in accordance with the digital value to be converted and the output signals thereof are summed-up and form the analog value. However, if critical, basically known word combinations, for instance 01111 to 10000 are switched, overvoltage peaks or so-called glitches can occur. The reasons for the glitches are the propagation time differences of sources being switched on and off simultaneously, the asynchronicity of the data on the bit lines and the different tolerances of weighted sources.

One conventional manner of preventing such overvoltage peaks is to use individual sources which are addressed by a thermometer decoder. In such a device, besides the decoding line assigned to the bit value of the digital value, the decoder also activates all other low-value decoding lines for addressing the individual sources. Due to the continuous increase of the number of chosen decoding lines, only one source is connected with an increasing binary word or only one source is switched off with a decreasing binary word. Therefore, the result of these word combinations is only the switching of a single source, although all binary bits change. Switching peaks due to the switching of several sources can be therefore not occur.

Such a single-step D/A converter is described in the journal "Elektroniker" No. 5/1976, Pages EL1 to EL8. However, this apparatus results in the need for large areas, which is due to the decoder, the wiring channel and the large number of individual sources. This is because a $2^n$ stage decoder and $2^n$ individual sources are required for converting a digital word that is n-bits wide. The fan-in this $2^n$ decoder stage limits the field of the use to high frequencies. A D/A converter of the type mentioned above has the disadvantage of requiring several ROMs in series for decoding the row information.

It is accordingly an object of the invention to provide a D/A converter, which overcomes the hereinafore-mentioned disadvantages of the heretofore-known devices of this general type, and to decrease the requirement for area and circuitry for a D/A converter of this type.

With the foregoing and other objects in view there is provided, in accordance with the invention, a single-step D/A converter, comprising: a multiplicity of individual interconnected sources disposed in a matrix having matrix rows and matrix columns; a decoder apparatus connected to the matrix for addressing the individual sources, the decoder apparatus including a column decoder for addressing at least the more significant part of an n-bit-wide digital word to be converted and a row decoder in the form of a thermometer decoder; a logic apparatus connected between the decoder apparatus and the matrix for determining the matrix column of one of the individual sources being addressed and for suppressing switching over of the individual sources of others or the remainder of the columns, the logic apparatus including first and second logic devices, the first logic device being connected between the column decoder and the matrix for deriving further column information ($E_i$) and additional information ($S_i$) from column information ($X_i$) in accordance with the logical equations:

$$E_i = \overline{X_i} \text{ and } S_i = \overline{E_i E_{i-1}},$$

the second logic device being assigned to each of the individual sources ($Q_{ik}$) in accordance with the following logical combinations with row information ($Z_k$):

| $E_i$ | $S_i$ | $Z_k$ | $Q_{ik}$ |
|---|---|---|---|
| 1 | 0 | X | disconnected for entire column |
| 0 | 1 | X | connected for entire column |
| 1 | 1 | 0 | on |
| 1 | 1 | 1 | off; | a multiplicity of synchronizing circuits each being connected between the second logic device and a respective one of the individual sources; and a common clock line connected to all of the synchronizing circuits.

The invention is based on the feature of connecting two thermometer decoders to a source matrix. Instead of an m of $2^n$ decoders, two m of $2^{n/2}$ decoders with $2^{n/2}$ stages are advantageously used. At the crossing point of the matrix, the steps or staggering of an m of $2^n$ decoder can be simulated by the row and column information.

The cost of the wiring is reduced by the use of a two-dimensional matrix field. The capacities in the wiring are therefore reduced, which permits operation at high frequencies. This results in a shorter gate propagation time and therefore a shortening of the conversion time. By splitting the input stages, a reduction of the fan-in of the converter and a reduction of the power loss are achieved. This is true particularly for a construction in single-channel MOS-technology, since the NAND-functions customarily used in m of $2^n$ decoders with more than two inputs can only be provided with difficulty. They must be provided by transformations of an X-times input NAND-gate with additional non-minimized gates.

Other features which are considered as characteristic for the invention are set forth in the appended claims.

Although the invention is illustrated and described herein as embodied in a D/A converter, it is nevertheless not intended to be limited to the details shown since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 2 is a diagrammatic and partly schematic view showing details of the D/A converter according to FIG. 1;

FIGS. 5 and 6 are diagrammatic views of examples for critical switching states of the apparatus according to the invention.

Figures 1, 4:
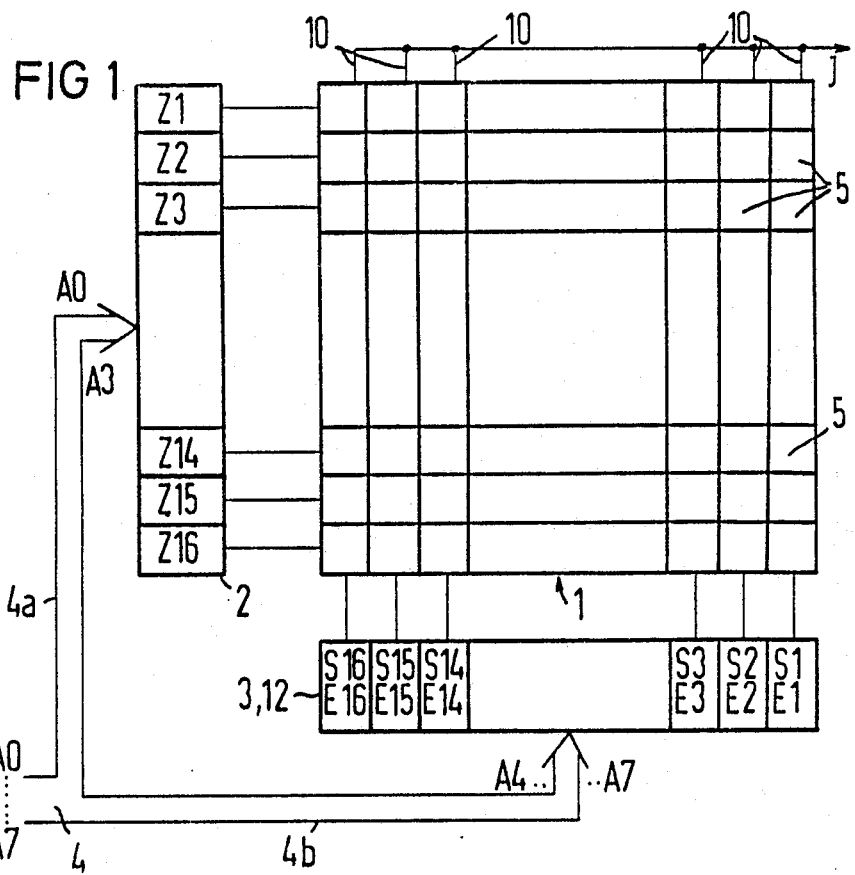
FIG. 1 is a diagrammatic view of a D/A converter according to the invention.
FIG. 4 is a table showing control signals for the apparatus according to FIGS. 2 and 3.

Referring now to the figures of the drawings in detail and first, particularly, to FIG. 1 thereof, it is seen that the D/A converter is formed of a source field in a matrix configuration 1, a row decoder 2 and a first logic device 12 following a column decoder 3. At each matrix element or point 5 of the matrix configuration 1 there is an individual source, such as a current or voltage souce, each of which is tied to a current bus 10 by addressing them through the two decoders column-by-column, at which location a summed-up analog signal $I_{AUS}$ can be taken off at a line combining all of the current buses 10.

The digital signal A0 to A7 to be converted is fed to the two decoders 2, 3 through n-parallel digital lines 4. The row decoder 2 is associated with the less significant bits A0 to $A_{(n/2)-1}$, while the column decoder 3 takes over the weighting of the more significant bits $A_{n/2}$ to $A_n$. Corresponding to the respective $2^{n/2}$ stages, two m of $2^{2/2}$ decoders are required. The matrix 1 comprises $2^{n/2} \times 2^{n/2}$ individual sources. The embodiment shown in FIG. 1 is laid out for a data word A0 to A7 which is 8 bits wide and therefore a maxtrix 1 comprises 16×16 individual sources. The row and column decoders 2, 3 are constructed as thermometer decoders.

FIG. 2 shows, by way of example, how additional information $S_i$ is determined at the output of the column decoder 3 by a logical connection betwen adjacent output coding lines, which determines the one column $X_i$ in which the decoder graduation is actually realized, according to the coding of the row decoder 2. This information is used to make the sources 6 of all those columns which are associated with lower column lines completely active and independent of the condition of the row decoder 2, while the source of those columns which have higher significance cannot be activated.

In the illustrated embodiment, the row and column decoders 2, 3 comprise k or i decoder sstages (k, i=1 to 15). The matrix element 5 with an individual source 6 actually selected over the row decoder stages $Z_{(1-16)}$ and the column decoder stages $X_i$, is designated with reference symbol $Q_{ik}$. The individual source 6 is connected to a supply line 9 on the input side and to a current bus 10 on the output side. The control input of the individual source 6 is connected through a logic device 7 to the corresponding row line $Z_k$ acted upon by an inverted signal, a further column line $E_i$ and the additional information line $S_i$.

The drive is synchronized by means of a synchronizing circuit 11 controlled by a clock line 8. The synchronizing circuit 11 is formed of an FET, which is connected between the logic device 7 and the corresponding individual source 6. The information from the row decoder 2 and the column decoder 3 is therefore interlinked with the additional information at the matrix point 5 to form a control signal for the individual source 6. The clock line 8, the supply line 9 and the current bus 10 are looped through together for all of the elements or sources $Q_{ik}$. In the examples shown, the loop is meander-shaped, so that adjacent matrix columns are traversed sequentially.

The operation of the logic device 7 can be seen from the table shown in FIG. 4. FIG. 4 shows that in a logical 0 state of the additional information line $S_i$ and for a logical 1 state of the further column line $E_i$, all of the individual sources 6 of the respective column $X_i$ are disconnected, independently of the state of the associated row line $Z_k$. In the case of a logical 1 and a logical 0 state of the additional information decoder stage $S_i$ and the further column line $E_i$, respectively, all of the current sources of the corresponding column $X_i$ are connected independently of the signal on the row line. If the information line $S_i$ as well as the further column line $E_i$ are at a logical 1 state, the individual source 6 of the source element $Q_{ik}$ is switched on for a logical 0 state on the row line and, for a logical 1 state of the lines $S_i$, $E_i$ and $Z_k$, the sources 6 are switched off, corresponding to the row decoder Z.

The signals on the additional information line $S_i$ and the further column line $E_i$ are generated from the signal of the column line $X_i$ in a logic device 12 following the column decoder 3. This is done by the following logical equations:

$$E_i = \overline{X_i} \text{ and } S_i = \overline{E_i E_{i-1}},$$

where the information on the information line is designated $S_i$, and the information on the column of a further column line is designated $X_i$ or $E_i$, respectively.

Figure 3:
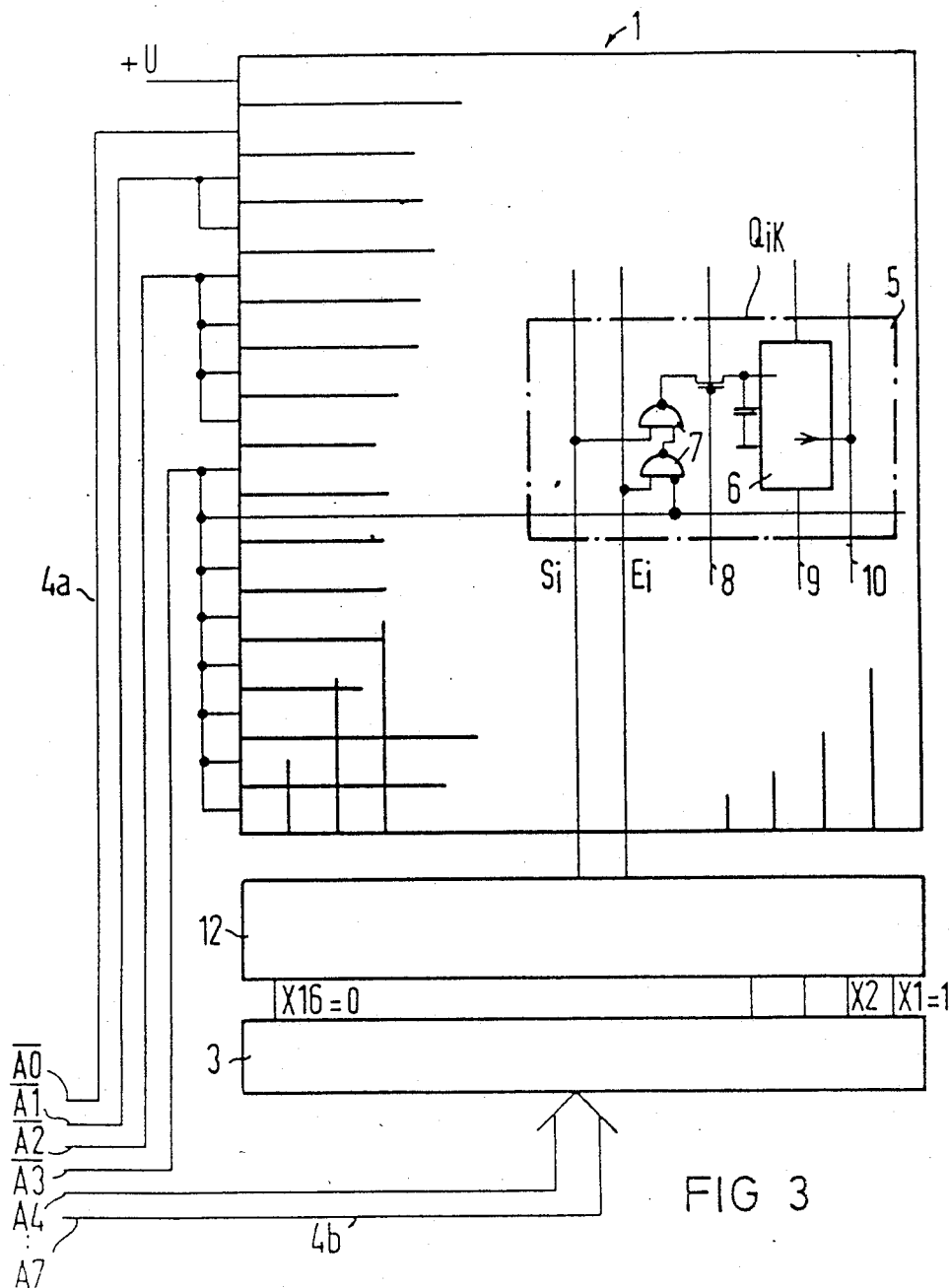
FIG. 3 is a diagrammatic and partly schematic view showing details of a further D/A converter.

FIG. 3 shows an embodiment of a matrix 1, comprising 16×16 individual sources, which is addressed by individual weighting on negated less significant bits A0 to A3 (rows Z1 to Z16) and which is addressed for the higher significance bits A4 to A7 (columns X1 to X16) by means of binary weighting. In the individual weighting the addressing of the rows Z1 to Z16 is derived directly from the part of the binary word which comprises the four low significance bits. As FIG. 3 shows, the corresponding digital lines 4a are weighted corresponding to the value of their information and are connected with n respective row lines. The structure and operation of the matrix elements 5, the column decoder 3 and the logic device 12 correspond to the embodiment shown in FIG. 2. In the defined starting position, the information X16=0 and X1=1.

A further saving of area with a simultaneous satisfactory suppression of the overvoltage peaks, is achieved by saving input lines by tying together matrix elements 5 according to the weighting and the row decoder.

FIGS. 5 and 6 diagrammatically illustrate respective switching states of the individual sources 6 when switching critical word combinations. Individual sources which are connected are each identified in FIGS. 5 and 6 by a respective "X". In the first example shown in FIG. 5, the transition from a digital word 00100111 present at the digital lines A7 to A0 to a digital word 00101000 is given. The corresponding logical states H and L are given at the outputs of the row decoder 2 and the signals belonging to the column lines X1 to X16 on the further column lines $S_i$ and addition information lines $E_i$ are given at the column decoder 3. In the transition from the first state Ia to the second state IIa, only one individual source is added to row Z8 and the column X3 in spite of the critical word combination.

In the example given in FIG. 6, only one individual source is added in row Z16 and column X8 in the transition of a binary word 01111111 (state Ib) to 10000000 (state IIb), wherein the change of the states at the row decoder 2 are not a governing factor for the addition of the individual source $Q_{16,8}$, but instead the individual source is activated by the change of $E_8$ and $S_8$.

Figure 7:
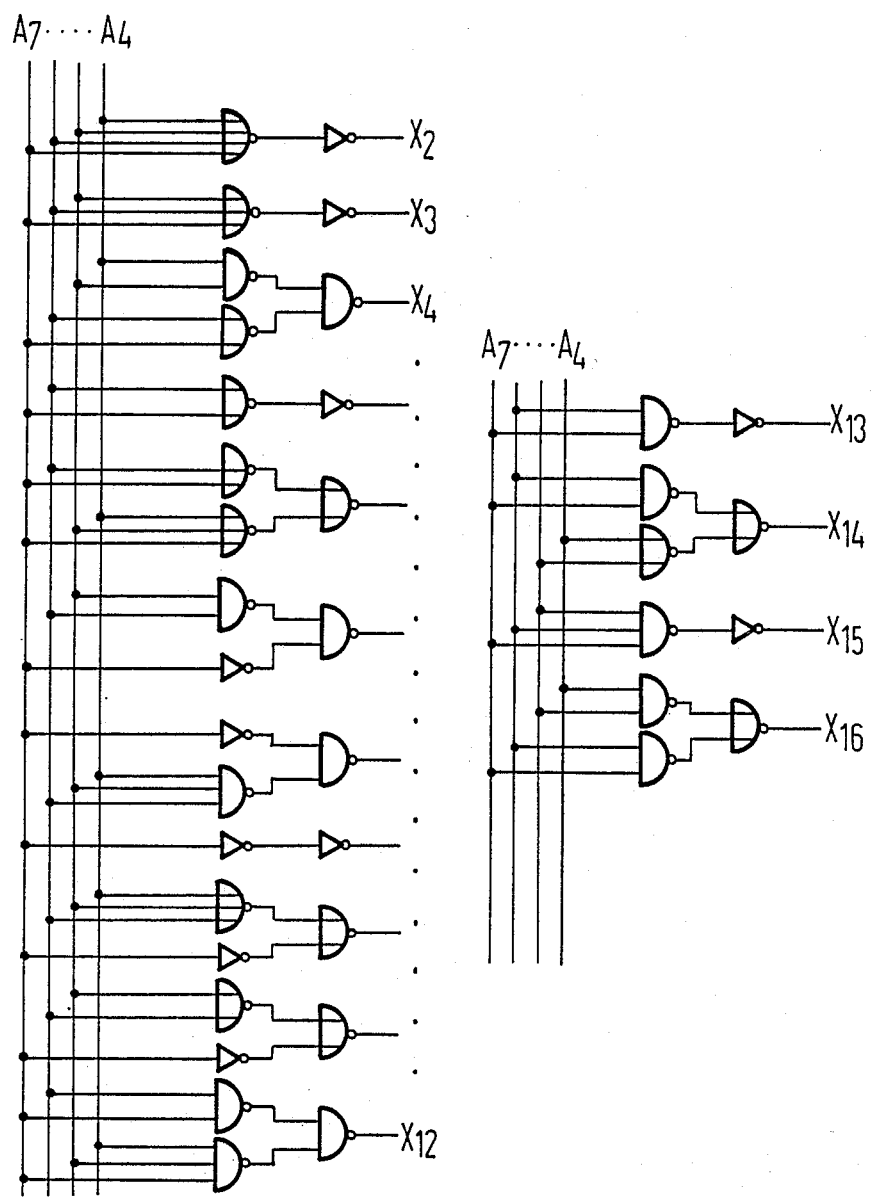
FIG. 7 is a schematic circuit diagram of a thermometer decoder.

FIG. 7 shows the circuit diagram of a thermometer decoder for decoding a four-digit binary word, such as is used as the column decoder 3. The four higher significance bits A4 to A7 are fed-in as the input variable. On the output side, column information $X_2$ to $X_{16}$ can be taken off. Inverters are connected into the signal paths which have no logical interlinkage member in comparison to parallel connected signal paths, so as to obtain signals with internal propagation times of equal length at each output. In this manner, all of the individual sources are switched simultaneously.

We claim:

1. Single-step D/A converter, comprising: a multiplicity of individual interconnected sources disposed in a matrix having matrix rows and matrix columns; a decoder apparatus connected to said matrix for addressing said individual sources, said decoder apparatus including a column decoder for addressing at least the more significant part of an n-bit-wide digital word to be converted and said column decoder in the form of a thermometer decoder; a logic apparatus connected between said decoder apparatus and said matrix for determining said matrix column of one of said individual sources being addressed and for suppressing switching over of said individual sources of others of said columns, said logic apparatus including first and second logic devices, said first logic device being connected between said column decoder and said matrix for deriving further column information ($E_i$) and additional information ($S_i$) from column information ($X_i$) in accordance with the logical equations:

$$E_i = \overline{X_i} \text{ and } S_i = \overline{E_i E_{i-1}},$$

said second logic device being assigned to each of said individual sources ($Q_{ik}$) in accordance with the following logical combinations with row information ($Z_k$):

| $E_i$ | $S_i$ | $Z_k$ | $Q_{ik}$ |
|---|---|---|---|
| 1 | 0 | X | disconnected for entire column |
| 0 | 1 | X | connected for entire column |
| 1 | 1 | 0 | on |
| 1 | 1 | 1 | off; | the X given as the row information ($Z_k$) being a "don't care" condition; a multiplicity of synchronizing circuits each being connected between said second logic device and a respective one of said individual sources; and a common clock line connected to all of said synchronizing circuits.

2. D/A converter according to claim 1, wherein said matrix is quadratic and said decoder apparatus includes one m of $2^{n/2}$ row decoder and one m of $2^{n/2}$ column decoder wherein n equals the number of digital input lines.

3. D/A converter according to claim 1, wherein said matrix is directly addressed row-wise by the less significant part of the digital word to be converted.

4. D/A converter according to claim 1, wherein said common clock line sequentially traverses all of said columns of said matrix in meander fashion.

5. D/A converter according to claim 4, including a current bus interconnecting all of said individual sources.

6. D/A converter according to claim 4, including a supply line interconnecting all of said individual sources.

7. D/A converter according to claim 5, including a supply line interconnecting all of said individual sources.

8. D/A converter according to claim 1, wherein said thermometer decoder includes inverters and logical connecting members connected parallel to said inverters for establishing travelling time equalization in parallel signal paths.

* * * * *